United States Patent
Nakanishi et al.

(10) Patent No.: US 10,147,612 B2
(45) Date of Patent: Dec. 4, 2018

(54) METAL PATTERN FORMING METHOD

(71) Applicant: Kabushiki Kaisha Toshiba, Minato-ku (JP)

(72) Inventors: Tsutomu Nakanishi, Yokohama (JP); Yusuke Tanaka, Kawasaki (JP); Atsushi Hieno, Yokohama (JP); Yasuhito Yoshimizu, Yokkaichi (JP); Akihiko Happoya, Ome (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/687,992

(22) Filed: Aug. 28, 2017

(65) Prior Publication Data

US 2018/0277390 A1 Sep. 27, 2018

(30) Foreign Application Priority Data

Mar. 22, 2017 (JP) ................... 2017-056486

(51) Int. Cl.
  *H01L 21/3213* (2006.01)
  *H01L 21/033* (2006.01)
  *H01L 21/311* (2006.01)

(52) U.S. Cl.
  CPC .... *H01L 21/32134* (2013.01); *H01L 21/0332* (2013.01); *H01L 21/31144* (2013.01)

(58) Field of Classification Search
  None
  See application file for complete search history.

(56) References Cited

U.S. PATENT DOCUMENTS

| | | | | |
|---|---|---|---|---|
| 6,611,060 B1* | 8/2003 | Toyoda | ............. | H01L 21/31053 257/750 |
| 6,737,728 B1* | 5/2004 | Block | ................. | H01L 23/5223 257/296 |
| 2004/0052930 A1* | 3/2004 | Basol | ................. | H01L 21/7684 427/58 |
| 2006/0014343 A1* | 1/2006 | Kundalgurki | ..... | H01L 21/32134 438/238 |
| 2007/0238213 A1* | 10/2007 | Yamaguchi | ......... | B81C 1/00682 438/48 |
| 2009/0058940 A1* | 3/2009 | Fujii | .................... | B41J 2/14274 347/47 |
| 2011/0260239 A1* | 10/2011 | Oyu | .................... | H01L 29/4236 257/330 |
| 2017/0114472 A1* | 4/2017 | Choi | ........................ | C25F 3/06 |

FOREIGN PATENT DOCUMENTS

| | | |
|---|---|---|
| JP | 09-223857 | 8/1997 |
| JP | 2008-135685 | 6/2008 |
| JP | 2010-205803 | 9/2010 |

\* cited by examiner

*Primary Examiner* — Allan Olsen
(74) *Attorney, Agent, or Firm* — Oblon, McClelland, Maier & Neustadt, L.L.P.

(57) ABSTRACT

A metal pattern forming method according to an embodiment includes forming a metal film on a surface of a substrate by an electroless plating method, the substrate including a first layer including a protrusion and a recess, and a film thickness of the metal film being a half or more of a width of the recess; and performing wet etching, the metal film in the recess removed by the wet etching and the metal film on the protrusion remained after the wet etching.

16 Claims, 6 Drawing Sheets

METAL PATTERN FORMING METHOD

CROSS-REFERENCE TO RELATED APPLICATION

This application is based upon and claims the benefit of priority from Japanese Patent Application No. 2017-056486, filed on Mar. 22, 2017, the entire contents of which are incorporated herein by reference.

FIELD

Embodiments described herein relate generally to a metal pattern forming method.

BACKGROUND

When an underlayer material is etched by using a photoresist as a mask, an etching selectivity between the photoresist and the underlayer material becomes insufficient and a process becomes difficult in some cases. Hence, there is a method for patterning a metal film by using a photoresist as a mask and etching an underlayer material by using this metal film as a mask. The mask of this metal film is referred to as a hard mask.

Using dry etching to form a hard mask increases manufacturing cost of a semiconductor device. This is because the dry etching is a vacuum process, and therefore a throughput is low and process cost is high. Therefore, it is preferable to form a hard mask by using wet etching of a higher throughput and more reasonable process cost than dry etching.

As semiconductor devices are scaled-down, scaling-down of hard mask patterns is also demanded. The wet etching is isotropic etching, and therefore there is generally a significant pattern conversion difference between a photoresist mask and a pattern to be formed. It is desired to realize a method for forming a fine metal pattern which suppresses a pattern conversion difference between the metal pattern and a photoresist mask to scale down a hard mask pattern.

DETAILED DESCRIPTION

Figure 1A:
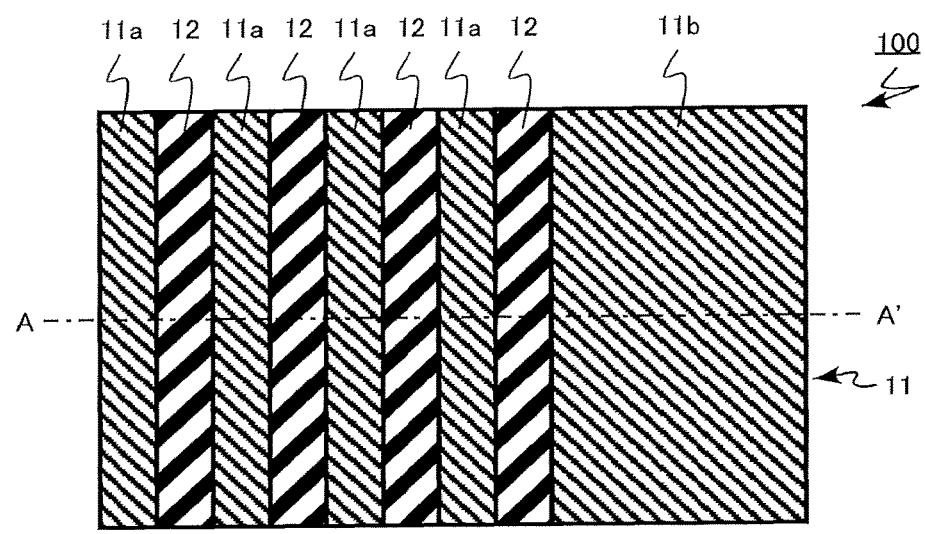
FIGS. 1A and 1B are schematic views during manufacturing of a semiconductor device formed by using a metal pattern forming method according to a first embodiment.

A metal pattern forming method according to an embodiment includes: forming a metal film on a surface of a substrate by an electroless plating method, the substrate including a first layer including a protrusion and a recess, and a film thickness of the metal film being a half or more of a width of the recess; and performing wet etching, the metal film in the recess removed by the wet etching and the metal film on the protrusion remained after the wet etching.

Embodiments of the present disclosure will be described below with reference to the drawings. The same or similar members will be assigned the same reference numerals below, and members which are described once will be optionally omitted.

First Embodiment

A metal pattern forming method according to the present embodiment includes: forming a metal film on a surface of a substrate by an electroless plating method, wherein the metal film has a half or more of a film thickness of a width of a recess, and the substrate includes a first layer including a protrusion and a recess; and performing wet etching, removing the metal film in the recess and leaving the metal film on the protrusion. Further, the substrate includes a second layer, the first layer is positioned above the second layer, and the second layer is etched by using as a mask the metal film on the protrusion after the wet etching.

Figure 1B:
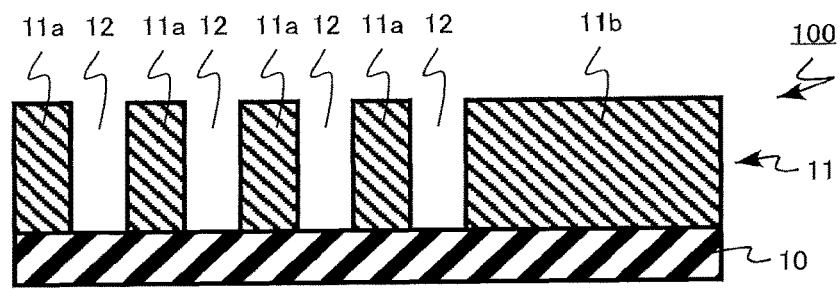

FIGS. 1A and 1B are schematic views during manufacturing of a semiconductor device 100 manufactured by using a metal pattern forming method according to the present embodiment. FIG. 1A is an upper view, and FIG. 1B is an A-A' cross sectional view of FIG. 1A. A case where a groove pattern is formed in the semiconductor device 100 will be described as an example in the present embodiment.

An oxide silicon layer 11 is formed on a silicon layer 10 in the semiconductor device 100. A plurality of grooves 12 of line shapes is formed in the oxide silicon layer 11. Narrow portions 11a and a wide portion 11b are provided on the oxide silicon layer 11.

The plurality of grooves 12 is provided to form, for example, a wiring layer in memory cells of a three-dimensional memory. Formation of the wiring layers in the memory cells of the three-dimensional memory demands formation of the grooves 12 of a high aspect ratio.

FIGS. 2A to 2D are explanatory views of the metal pattern forming method according to the present embodiment. FIGS. 2A to 2D are cross sectional views of a substrate on which a metal pattern is formed.

Figure 2A:
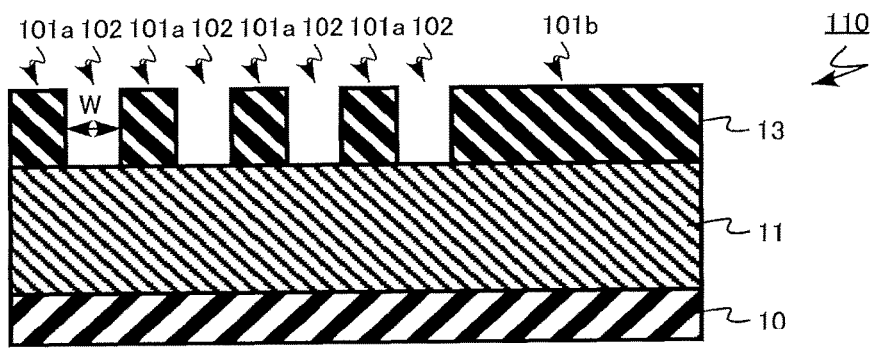
FIGS. 2A to 2D are explanatory views of the metal pattern forming method according to the first embodiment.

First, a substrate 110 is prepared (FIG. 2A). The substrate 110 is formed by using a known process technique.

The silicon layer 10, the oxide silicon layer 11 and a photoresist layer 13 are stacked on the substrate 110. The photoresist layer 13 is an example of a first layer including resin. The oxide silicon layer 11 is an example of a second layer.

The photoresist layer 13 includes protrusions 101a and 101b and recesses 102 on a surface. The width of the protrusion 101b is wider than each protrusion 101a.

The width of each recess 102 (W in FIG. 2A) is, for example, 200 nm or less. Disposition pitches of the protrusions 101a and the recesses 102 are, for example, 100 nm or less. The photoresist layer 13 is a guide pattern for forming the metal pattern.

In this regard, it is possible to observe and measure the width of each recess 102 and the disposition pitches of the protrusions 101a and the recesses 102 by using a SEM (Scanning Electron Microscope).

Next, a catalyst adlayer which is not illustrated is formed on the surface of the substrate 110. For the catalyst adlayer, molecules which realize both functions of adsorbing to the surface of the substrate 110 and supporting a catalyst for initial plating nucleus formation of electroless plating are used. For example, molecules including triazine rings of less adsorption dependency with respect to an underlayer material are used.

Next, a metal catalyst layer is formed by adsorbing a metal catalyst which is not illustrated to the catalyst adlayer is formed. The metal catalyst to be adsorbed is not limited in particularly as long as the metal catalyst is catalysts for electroless plating. For example, palladium (Pd) which can be used as catalysts for various types of plating is used.

Figure 2B:
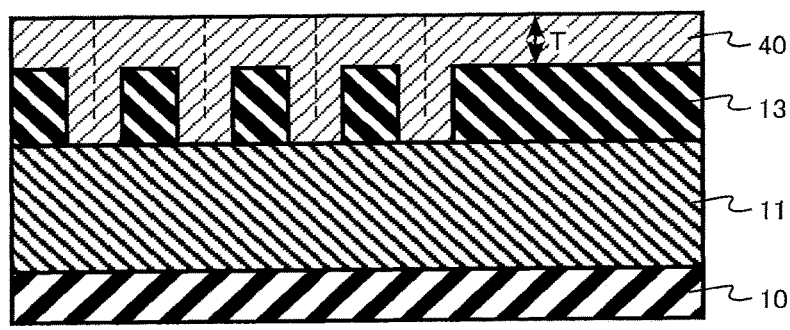

Next, a metal film 40 is formed by an electroless plating method (FIG. 2B). A film thickness of the metal film 40 (T in FIG. 2B) is a half or more of the width of each recess 102 (W in FIG. 2A). The width of each recess 102 is, for example, a minimum width of each recess 102. The film thickness of the metal film 40 is a half or more of the width of each recess 102, so that each recess 102 is buried by the metal film 40.

The average particle diameter of the metal film 40 is, for example, 5 nm or less. Further, the metal film 40 is, for example, amorphous.

The average particle diameter of the metal film 40 can be calculated by observing the average particle diameter by using a TEM (Transmission Electron Microscope), measuring major axes of a plurality of crystal particles at random and calculating an average of the major axes. Further, whether or not the metal film 40 is the amorphous can be decided based on whether or not crystal particles can be confirmed by observation using the TEM, The metal film 40 includes, for example, first metal and second metal of a lower content than the first metal. The first metal is at least one metal selected from a group including nickel (Ni), cobalt (Co) and copper (Cu), for example. Further, the second metal is at least one metal selected from a group including phosphorus (P), tungsten (W) and molybdenum (Mo), for example. The content of the second metal in the metal film 40 is, for example, 1 atomic % or more and less than 50 atomic %.

The metal film 40 is, for example, Ni—P, Co—P, Ni—Co—P, Ni—Fe—P, Ni—Mo—P, Ni—W—P, Co—W—P, Ni—Cu—P, Pd—Ni—P, Ni—Re—P, Ni—W, Co—W, Ni—W—B, Co—W—B, Ni—Mo, Co—Mo and Ni—Mo—B.

A composition of the metal film 40 can be measured by, for example, SIMS (Secondary Ion Mass Specrometry).

Figure 2C:
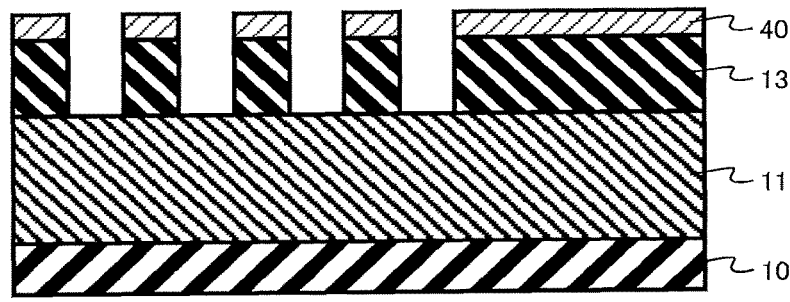

Next, the metal film 40 is etched by wet etching (FIG. 2C). The metal film 40 buried in the recesses 102 is removed by wet etching. Meanwhile, at least part of the metal film 40 on the protrusions 101a and the metal film 40 on the protrusion 101b is left. For example, an etching amount of the wet etching for the metal film 40 is a half or more of the width of each recess 102 (W in FIG. 2A), and is the film thickness of the metal film 40 (T in FIG. 2B) or less.

An appropriate wet etchant used for the wet etching is selected according to a type of the metal film 40.

Figure 2D:
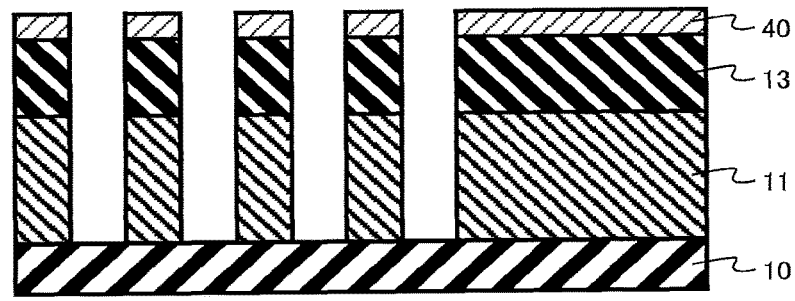

Next, the oxide silicon layer 11 is etched by using as a mask the metal film 40 on the protrusions 101a and the metal film 40 on the protrusion 101b (FIG. 2D). The oxide silicon layer 11 is etched by, for example, known anisotropic dry etching.

Subsequently, the metal film 40 and the photoresist layer 13 are removed to form a structure including the grooves 12 illustrated in FIGS. 1A and 1B. The metal film 40 and the photoresist layer 13 are removed by, for example, known wet etching.

Next, a function and an effect of the present embodiment will be described.

For example, in the three-dimensional memory, a memory cell array is three-dimensional, and an insulation layer and a semiconductor layer which are thick in a vertical direction with respect to a substrate are formed. Further, it is demanded to from a groove pattern or a hole pattern of a high aspect ratio in these thick insulation layer and semiconductor layer.

Formation of the groove pattern or the hole pattern of the high aspect ratio makes it difficult to secure a sufficient etching selectivity of the underlayer material and the photoresist and perform a process. Hence, there is a method for patterning a metal film by using a photoresist as a mask and etching an underlayer material by using this metal film as a mask. The mask of this metal film is referred to as a hard mask.

Using dry etching to form a hard mask increases manufacturing cost of a semiconductor device. This is because the dry etching is a vacuum process, and therefore a throughput is low and process cost is high. Therefore, it is preferable to form a hard mask by using wet etching of a higher throughput and more reasonable process cost than dry etching.

The wet etching is isotropic etching, and therefore there is a significant pattern conversion difference between a photoresist mask and a pattern to be formed. It is desired to realize formation of a fine metal pattern which suppresses a pattern conversion difference between the metal pattern and a photoresist mask to scale down a pattern.

In the present embodiment, the metal film 40 is patterned by using wet etching. Consequently, process cost is reduced. Further, for example, the electroless plating method which provides a higher throughput and lower process cost than, for example, a CVD method (Chemical Vapor Deposition method) or a spattering method is used to form the metal film 40. Consequently, the process cost is further reduced.

Pattern formation of the metal film 40 by wet etching will be described below.

During growth of the metal film 40 by the electroless plating method, the metal film 40 conformally grows in the recesses 102. That is, the metal film 40 having the same thickness grows on bottom faces and side faces of the recesses 102. When the film thickness becomes a half or more of the width of each recess 102 (W in FIG. 2A), the metal film 40 growing from the both side faces of each recess 102 contact and form a contact portion (each broken line in FIG. 2B). The contact portion includes, for example, a physically narrow gap.

After the contact portion is formed, the growth from the side faces of the recess 102 stops since there is no gap for growth. Meanwhile, the metal film 40 continues growing upward. Hence, the metal film 40 which is thick upward is formed. The film thickness of the metal film 40 (T in FIG. 2B) is a half or more of the width of each recess 102 (W in FIG. 2A) to bury each recess 102.

During wet etching of the metal film 40, the contact portion is isotropically etched to remove the metal film 40 in each recess 102. The metal film 40 is etched by the wet etchant infiltrating the contact portion.

The etching of the metal film 40 progresses sideways and downward from the contact portion, so that the metal film 40 on the protrusions 101a and the metal film 40 on the protrusion 101b are left. Hence, a pattern conversion difference between a pattern of the photoresist layer 13 and a pattern of the remaining metal film 40 is suppressed.

The etching amount of the wet etching for the metal film 40 is preferably a half or more of the width of each recess 102 (W in FIG. 2A) and less than the film thickness of the metal film 40 (T in FIG. 2B) to remove the metal film 40 in the recesses 102 and leave the metal film 40 on the protrusions 101a and the metal film 40 on the protrusion 101b.

From a viewpoint of acceleration of etching of the metal film 40 sideways from the contact portion, the average particle diameter of the metal film 40 is preferably small. The average particle diameter of the metal film 40 is preferably 5 nm or less. Further, the metal film 40 is preferably amorphous.

The metal film 40 has the small average crystal particle diameter and is amorphous, so that a wet etching rate of the metal film 40 is suppressed. Hence, an infiltration time taken by the wet etchant to infiltrate the contact portion is bought, so that etching is relatively promoted sideways from the contact portion.

From a viewpoint that the metal film 40 has the small average particle diameter and is amorphous, the metal film 40 preferably includes the second metal which is at least one metal selected from the group consisting of phosphorus (P), tungsten (W) and molybdenum (Mo). The content of the second metal in the metal film 40 is preferably 1% or more and less than 50%.

From a viewpoint to make an average crystal particle diameter of the metal film 40 small and make the metal film 40 amorphous, the metal film 40 is preferably Ni—P, Co—P, Ni—Co—P, Ni—Fe—P, Ni—Mo—P, Ni—W—P, Co—W—P, Ni—Cu—P, Pd—Ni—P, Ni—Re—P, Ni—W, Co—W, Ni—W—B, Co—W—B, Ni—Mo, Co—Mo and Ni—Mo—B.

From a viewpoint of conformity to other semiconductor manufacturing processes, the first metal is preferably at least one metal selected from the group consisting of nickel (Ni), cobalt (Co) and copper (Cu), for example.

Further, according to the metal pattern forming method according to the present embodiment, the metal film 40 is left on the protrusions 101*a* and the protrusion 101*b* of the photoresist layer 13. Consequently, as illustrated in FIG. 2C, it is possible to form as a hard mask the same metal pattern as the pattern of the photoresist layer 13 which is the guide pattern. Consequently, as illustrated in FIG. 2D, it is possible to form a groove pattern close to a design pattern in the underlayer oxide silicon layer 11.

FIGS. 3A to 3E are explanatory views of a metal pattern forming method according to a first comparative example. FIGS. 3A to 3E are cross sectional views of a substrate on which a metal pattern is formed.

The metal pattern forming method according to the first comparative example differs from the present embodiment in leaving as a hard mask a metal film 40 in recesses of a photoresist layer 13 which is a guide pattern.

Figure 3A:
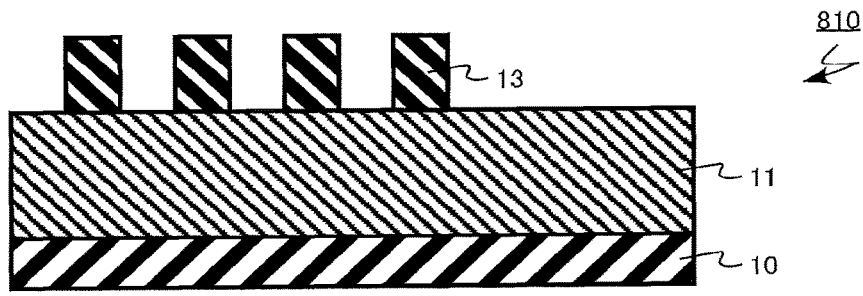
FIGS. 3A to 3E are explanatory views of the metal pattern forming method according to a first comparative example.

First, a substrate 810 is prepared (FIG. 3A). The substrate 810 is formed by using a known process technique.

A silicon layer 10, an oxide silicon layer 11 and the photoresist layer 13 are stacked on the substrate 810. The same pattern as a pattern of grooves 12 in FIGS. 1A and 1B is formed as protrusions in the photoresist layer 13. In other words, there is no photoresist layer 13 at a portion corresponding to the oxide silicon layer 11 in FIGS. 1A and 1B, i.e., at narrow portions 11*a* and a wide portion 11*b*.

Next, a catalyst adlayer which is not illustrated is formed on a surface of the substrate 810, and a metal catalyst layer which is not illustrated is formed on the catalyst adlayer.

Figure 3B:
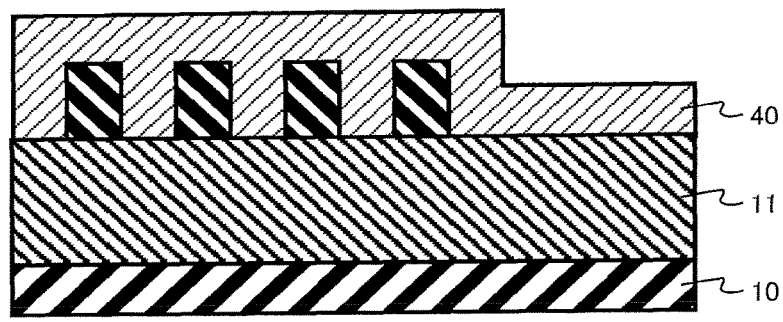

Next, the metal film 40 is formed by an electroless plating method (FIG. 3B). The film thickness of the metal film 40 is a half or more of the width of each recess. The film thickness of the metal film 40 is a half or more of the width of each recess 102, so that each recess 102 is buried by the metal film 40.

Figure 3C:
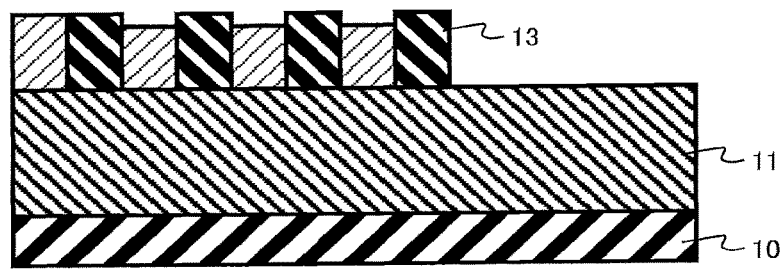

Next, the metal film 40 is etched by wet etching (FIG. 3C). The metal film 40 is removed on protrusions of the photoresist layer 13. The metal film 40 buried in the recesses is left. In this case, the metal film 40 in the wide recess is removed.

Figure 3D:
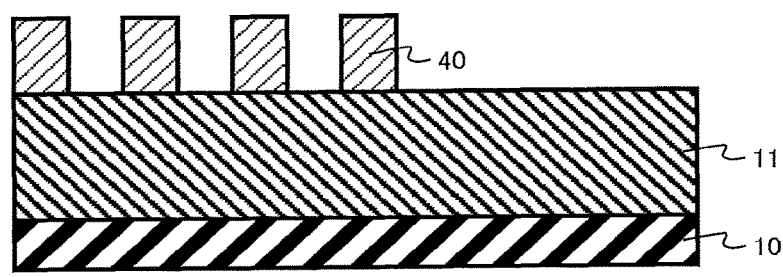

Next, the photoresist layer 13 is selectively removed (FIG. 3D).

Figure 3E:
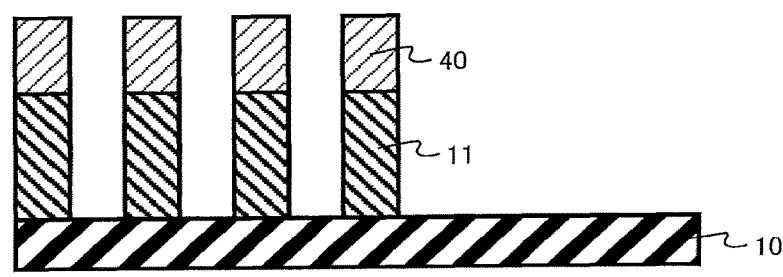

Next, the oxide silicon layer 11 is etched by using the metal film 40 as a mask (FIG. 3E).

Subsequently, the metal film 40 is removed. As illustrated in FIG. 3E, according to the method according to the first comparative example, the wide portion 11*b* of the oxide silicon layer 11 in the structure illustrated in FIGS. 1A and 1B is not formed, and a groove is formed instead. Further, the groove 12 at an end of the grooves 12 of line shapes is not formed. Therefore, the method according to the first comparative example has difficulty informing a pattern close to the design pattern.

As described above, the metal pattern forming method according to the present embodiment can form a fine pattern by using wet etching. Further, it is possible to form a pattern close to a design pattern.

Second Embodiment

A metal pattern forming method according to the present embodiment is the same as the first embodiment other than that a hole pattern is formed instead of a groove pattern. Hence, contents which overlap contents of the first embodiment will not be described.

Figure 4A:
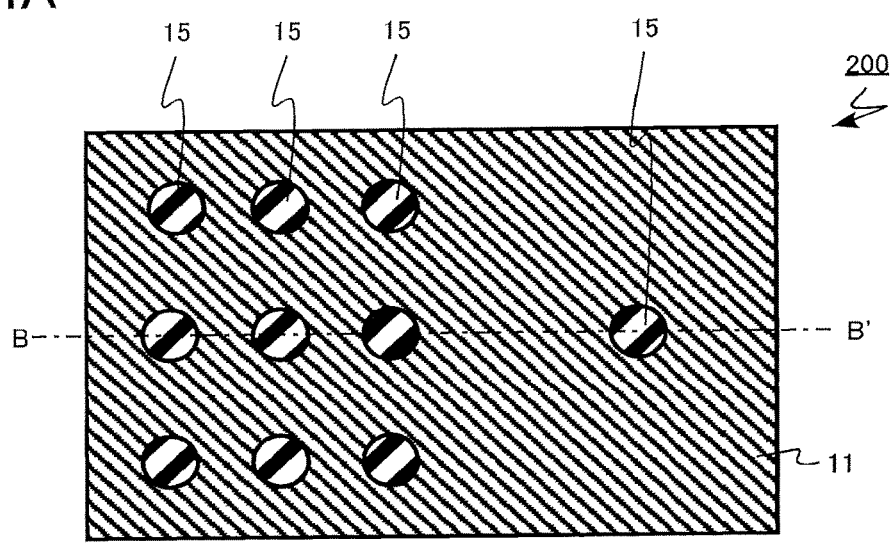
FIGS. 4A and 4B are schematic views during manufacturing of a semiconductor device formed by using a metal pattern forming method according to a second embodiment.
Figure 4B:
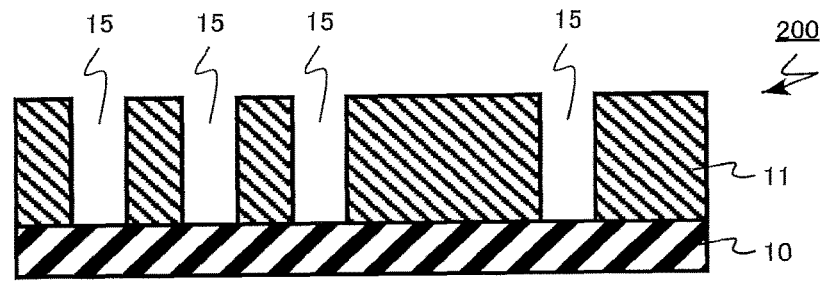

FIGS. 4A and 4B are schematic views during manufacturing of a semiconductor device 200 manufactured by using the metal pattern forming method according to the present embodiment. FIG. 4A is an upper view, and FIG. 4B is a BB' cross sectional view of FIG. 4A. A case where the hole pattern is formed in the semiconductor device 200 will be described as an example in the present embodiment.

An oxide silicon layer 11 is formed on a silicon layer 10 in the semiconductor device 200. A plurality of holes 15 is formed in the oxide silicon layer 11. The holes 15 which are closely disposed and the independent hole 15 are provided.

The plurality of holes 15 is provided to form, for example, contact holes of peripheral circuits of a three-dimensional memory. Formation of contact holes of the peripheral circuits of the three-dimensional memory demands formation of the holes 15 of a high aspect ratio.

FIGS. 5A to 5D are explanatory views of the metal pattern forming method according to the present embodiment. FIGS. 5A to 5D are cross sectional views of a substrate on which a metal pattern is formed.

Figure 5A:
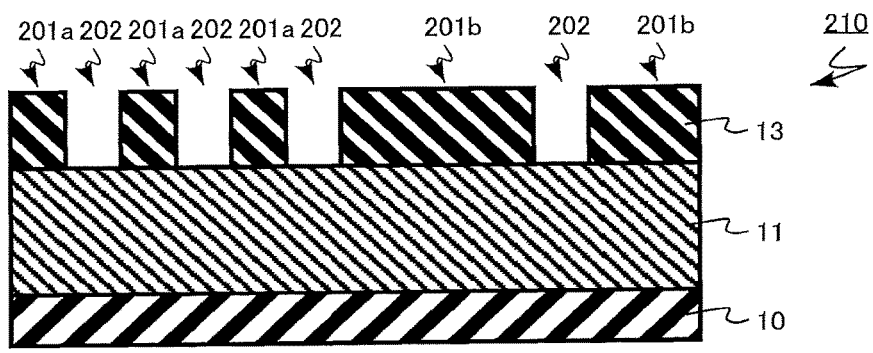
FIGS. 5A to 5D are explanatory views of the metal pattern forming method according to the second embodiment.

First, a substrate 210 is prepared (FIG. 5A). The substrate 210 is formed by using a known process technique.

The silicon layer 10, the oxide silicon layer 11 and a photoresist layer 13 are stacked on the substrate 210.

The photoresist layer 13 includes protrusions 201*a* and 201*b* and recesses 202 on a surface. The width of each protrusion 201*b* is wider than each protrusion 201*a*.

The width of each recess 202 is, for example, 200 nm or less. Disposition pitches of the protrusions 201*a* and the recesses 202 are, for example, 100 nm or less. The photoresist layer 13 is a guide pattern for forming the metal pattern.

Next, a catalyst adlayer which is not illustrated is formed on a surface of the substrate 210, and a metal catalyst layer which is not illustrated is formed on the catalyst adlayer.

Figure 5B:
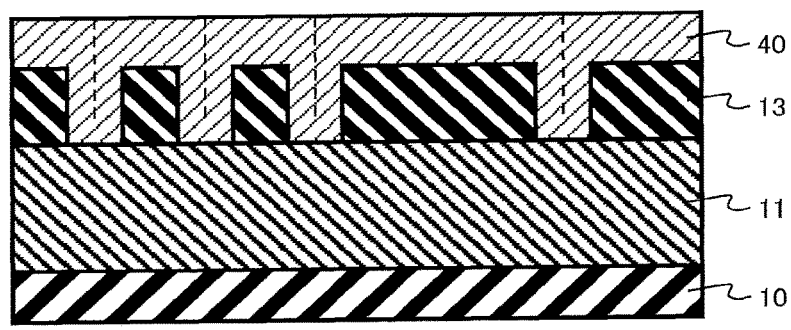

Next, a metal film 40 is formed by an electroless plating method (FIG. 5B). The film thickness of the metal film 40 is a half or more of the width of each recess 202.

The average particle diameter of the metal film 40 is, for example, 5 nm or less. Further, the metal film 40 is, for example, amorphous.

The metal film 40 includes, for example, first metal and second metal of a lower content rate than the first metal. The first metal is at least one metal selected from a group consisting of nickel (Ni), cobalt (Co) and copper (Cu), for example. Further, the second metal is at least one metal selected from a group consisting of phosphorus (P), tungsten (W) and molybdenum (Mo), for example. The content of the second metal in the metal film 40 is, for example, 1 atomic % or more and less than 50 atomic %.

The metal film 40 is, for example, Ni—P, Co—P, Ni—Co—P, Ni—Fe—P, Ni—Mo—P, Ni—W—P, Co—W—P, Ni—Cu—P, Pd—Ni—P, Ni—Re—P, Ni—W, Co—W, Ni—W—B, Co—W—B, Ni—Mo, Co—Mo and Ni—Mo—B.

Figure 5C:
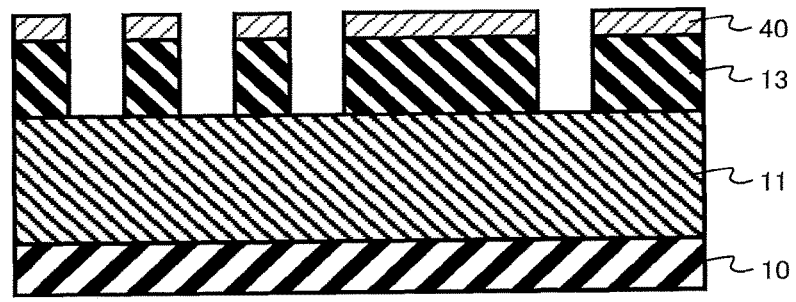

Next, the metal film 40 is etched by wet etching (FIG. 5C). The metal film 40 buried in the recesses 202 is removed by wet etching. Meanwhile, at least part of the metal film 40 on the protrusions 201a and the metal film 40 on the protrusions 201b is left.

Figure 5D:
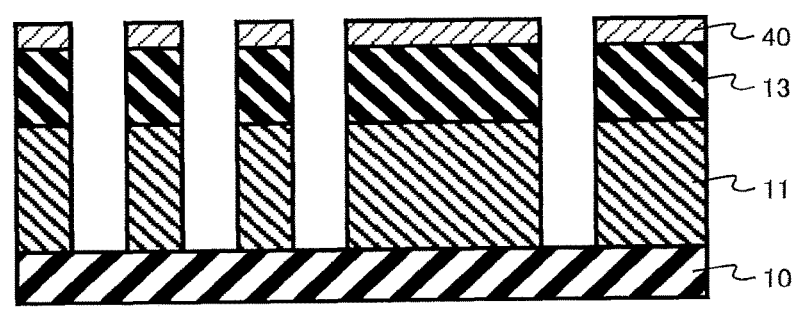

Next, the oxide silicon layer 11 is etched by using as a mask the metal film 40 on the protrusions 201a and the metal film 40 on the protrusions 201b (FIG. 5D). The oxide silicon layer 11 is etched by, for example, known anisotropic dry etching.

Subsequently, the metal film 40 and the photoresist layer 13 are removed to form a structure including the holes 15 illustrated in FIGS. 4A and 4B. The metal film 40 and the photoresist layer 13 are removed by, for example, known wet etching.

Further, according to the metal pattern forming method according to the present embodiment, the metal film 40 is left on the protrusions 201a and the protrusions 201b of the photoresist layer 13 similar to the first embodiment. The protrusions 201a and the protrusions 201b correspond to a region between the holes 15 in FIGS. 4A and 4B. Consequently, as illustrated in FIG. 5C, it is possible to form as a hard mask the same metal pattern as the pattern of the photoresist layer 13 which is the guide pattern. Consequently, as illustrated in FIG. 5D, it is possible to form a groove pattern close to a design pattern in the underlayer oxide silicon layer 11.

FIGS. 6A to 6E are explanatory views of a metal pattern forming method according to a second comparative example. FIGS. 6A to 6E are cross sectional views of a substrate on which a metal pattern is formed.

The metal pattern forming method according to the second comparative example differs from the present embodiment in leaving as a hard mask a metal film 40 in recesses of a photoresist layer 13 which is a guide pattern.

Figure 6A:
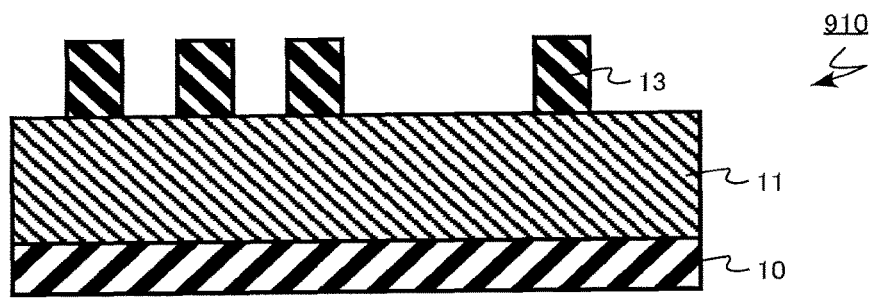
FIGS. 6A to 6E are explanatory views of the metal pattern forming methods according to a second comparative example.

First, a substrate 910 is prepared (FIG. 6A). The substrate 910 is formed by using a known process technique.

A silicon layer 10, an oxide silicon layer 11 and the photoresist layer 13 are stacked on the substrate 910. The same pattern as a pattern of holes 15 in FIGS. 4A and 4B is formed as protrusions in the photoresist layer 13. In other words, there is no photoresist layer 13 at a portion corresponding to the oxide silicon layer 11 in FIGS. 4A and 4B.

Next, a catalyst adlayer which is not illustrated is formed on a surface of the substrate 910, and a metal catalyst layer which is not illustrated is formed on the catalyst layer.

Figure 6B:
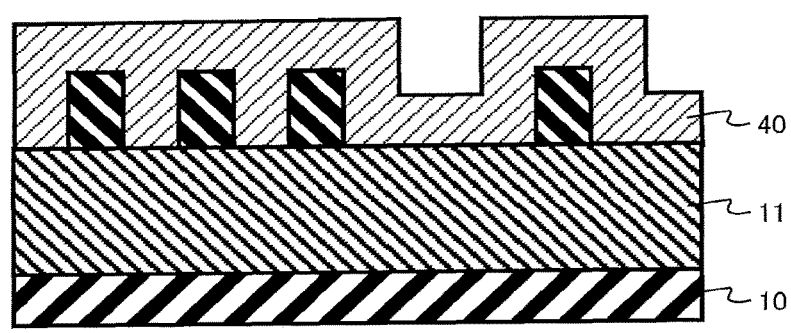

Next, the metal film 40 is formed by an electroless plating method (FIG. 6B). The film thickness of the metal film 40 is a half or more of the width of each recess. The film thickness of the metal film 40 is a half or more of the width of each recess 102, so that each recess 102 is buried by the metal film 40.

Figure 6C:
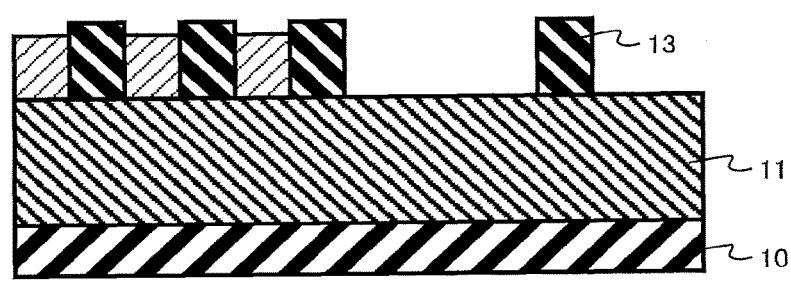

Next, the metal film 40 is etched by wet etching (FIG. 6C). The metal film 40 on protrusions of the photoresist layer 13 is removed. The metal film 40 buried in the recesses is left. In this case, the metal film 40 in the width recess is removed.

Figure 6D:
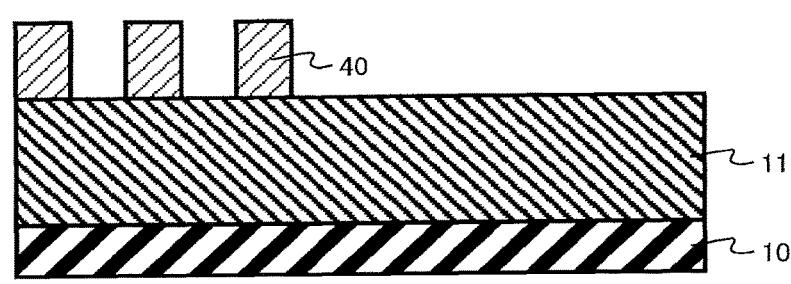

Next, the photoresist layer 13 is selectively removed (FIG. 6D).

Figure 6E:
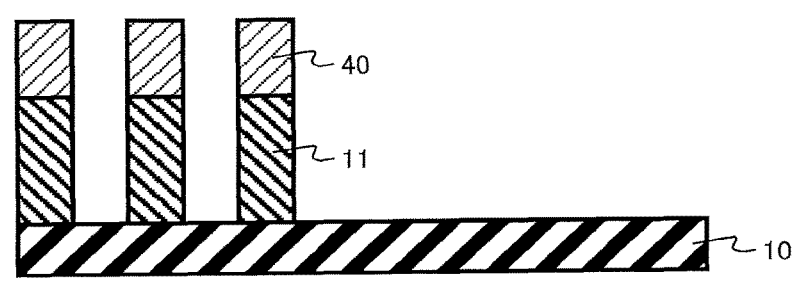

Next, the oxide silicon layer 11 is etched by using the metal film 40 as a mask (FIG. 6E).

Subsequently, the metal film 40 is removed. As illustrated in FIG. 6E, according to the method according to the comparative example, the pattern of the holes 15 which are closely disposed in the structure illustrated in FIGS. 4A and 4B is formed. However, a pattern of the isolated hole 15 and the holes 15 at an end of the holes 15 which are closely disposed is not formed as designed, and the entire oxide silicon layer 11 is etched. Therefore, the method according to the second comparative example has difficulty in forming a pattern close to the design pattern.

As described above, the metal pattern forming method according to the present embodiment can form a fine pattern by using wet etching similar to the first embodiment. Further, it is possible to form a pattern close to a design pattern.

Examples where a photoresist is a material of a first layer which includes protrusions and recesses and is a guide pattern have been described in the first and second embodiments. However, the first layer is not limited to the photoresist. For example, photosetting resin can be also used as another resin. The photosetting resin is a photosetting resist used for nano imprint, for example. Further, for the first layer, resin and, in addition, an oxide, a nitride, an oxynitride or carbon can also be used.

Examples where oxide silicon is used as a material of a second layer which is etched by using the metal film 40 as a hard mask have been described in the first and second embodiments. However, the second layer is not limited to the oxide silicon. Further, an oxide, a nitride, an oxynitride, a semiconductor, resin, metal or carbon can also be used. Furthermore, the second layer may adopt a structure on which the above materials are stacked.

Cases where molecules including triazine rings are used for a catalyst adlayer have been described in the first and second embodiments. However, the molecules used for the catalyst adlayer are not limited to molecules including the triazine ring. Molecules which realize both functions of adsorbing to an underlayer material and a function of supporting a catalyst for initial plating nucleus formation of electroless plating may be used.

The function of adsorbing to the underlayer material more specifically means that catalyst adlayer molecules physically or chemically adsorb to the underlayer material. The adsorption is caused by an interaction such as covalent bonding, ionic bonding, coordinate bonding, hydrogen bonding or an intermolecular force between at least one or more functional groups of a molecular terminal or a molecular framework, and chemical species on a substrate face. It is known that this interaction differs according to a material of the underlayer to adsorb to, and it is effective to use molecules matching the material of the underlayer.

When, for example, the material of the underlayer material is metal such as Au, Ag, Cu, Pt or Pd or compound semiconductor such as GaAs or InP, molecules having functional groups such as a thiol group (—SH), a disulfide group (—S—S—), a thioisocyanate group (—SCN) or a nitrile group (—NC) at molecular terminals can be used. When, for example, the material of the underlayer material is basic oxide such as $Al_2O_3$, AgO or CuO, molecules including functional groups such as a carboxyl group (—COOH) or a phosphate group (—PO(OH),) at molecular terminals are effective. Further, when the underlayer material is other oxides such as $SiO_2$, $SnO_2$, $GeO_2$, $ZrO_2$, $TiO_2$, $Al_2O_3$, ITO or PZT, molecules including functional groups such as a silanol group (—SiOH), chlorosilane (—SiCl), methoxysilane (—$SiOCH_3$) or ethoxysilane (—$SiOC_2H_5$) at molecular terminals can be used. Furthermore, when the underlayer material is an organic matter, molecules having a vinyl group (—$CHCH_2$), an epoxy group (—$C_2H_4O$), an amino group (—$NH_2$) or a carboxyl group (—COOH) at molecular terminals are effective. Still further, molecules including triazine rings in molecular structures can be used irrespective of metal, oxides and organic matters.

Moreover, the catalyst supporting function causes an interaction such as covalent bonding, ionic bonding, coordinate bonding, hydrogen bonding or an intermolecular force between at least one or more functional groups of a molecular terminal or a molecular framework, and chemical species on a catalyst face likewise. In case of electroless plating, for example, for a Pd catalyst known to function as a catalyst for multiple types of metal, molecules including a functional group such as an amino group, (—$NH_2$), a thiol group (—SH), a disulfide group (—S—S—), a chloro (—Cl), a carbonyl group (—CO—) or a carboxyl group (—COOH) at terminals or molecules including triazine rings or pyridine rings in molecular structures can also be used.

A size of the catalyst adlayer molecules is preferably 5 nm or less. The catalyst adlayer is a monomolecular layer. When the size of the catalyst adlayer molecules exceeds 5 nm or the thickness of the molecular layer increases, the thickness of the catalyst adlayer becomes the same order as a pattern size of the guide pattern, and therefore the thickness of the catalyst adlayer cannot be ignored. As a result, a difference between the metal pattern to be made and the design pattern is concerned to become significant.

Film formation of the catalyst adlayer is performed by a wet process. A solvent can be selected by taking into account solubility of the catalyst adlayer molecules and solvent resistance of the underlayer. For example, alcohol, toluene or water can be used. As a method for forming the catalyst adlayer, a coating method which is widely and generally known such as a spin coating method, a dipping method, a blade method, a squeegee method or a microcontact method can be used. Above all, the dipping method which can easily control a dipping time and a dipping temperature is preferable. The dipping time and the dipping temperature can be optionally determined based on catalyst adlayer molecules to be used. However, it is preferably to more densely form a molecular film. For example, film formation can be performed under process conditions that a water contact angle of a surface is measured after formation of a catalyst adlayer, and a value of the contact angle saturates. Extra molecules which do not adsorb to a substrate are removed, and therefore it is preferable to perform a rinse process by using a solvent after dipping. Further, by performing a thermal process on the substrate after forming the catalyst adlayer, adhesion of the molecular film and the underlayer improves in some cases. The thermal process is preferably performed for an application which demands high adhesion of a metal film and an underlayer material. A thermal process condition is that, for example, a thermal process is performed for five minutes on a hot plate at 150° C.

Examples where palladium (Pd) is a metal catalyst to be adsorbed to the catalyst adlayer have been described in the first and second embodiment. However, the metal catalyst to be adsorbed is not limited in particularly as long as the metal catalyst is catalysts for electroless plating. For example, silver (Ag) or copper (Cu) can be also used.

In this regard, a Pd catalyst is given by a method which is widely and generally known such as a sensitizing-activation method, a catalyst-acceleration method or a method for dipping a Pd compound such as a palladium chloride hydrochloric acid solution or a Pd nanoparticle dispersion in a solution.

The terminal functional groups and the molecular frameworks of the molecules used as the catalyst adlayer support Pd. For example, an organic aminosilane material including the amino group is used as a catalyst adlayer, a substrate is dipped in the palladium chloride hydrochloric acid solution and then is rinsed by pure water, and thereby palladium ions adsorb to the amino group. Then, the Pd ions are reduced by a reductant solution to from the metal catalyst layer. The dipping time and the dipping temperature are optionally determined by catalyst adlayer molecules to be used or a metal catalyst processing method to be used. However, dipping is preferably performed under conditions that the amount of supported metal catalysts saturates. The amount of supported metal catalysts can be quantified by, for example, an ICP mass spectroscopy method.

EXAMPLE

An example and a comparative example will be described below.

(Example)

A resist pattern of a half pitch 40 nm was formed on a silicon substrate. The silicon substrate was dipped in an organic aminosilane solution of a concentration 0.1% for 30 seconds, and was rinsed by pure water for 15 seconds to form a catalyst adlayer. Next, the silicon substrate was dipped for 30 seconds in a palladium solution obtained by diluting a palladium chloride hydrochloric acid solution of 1 wt % to a solution of 1%, and was rinsed by pure water for 15 seconds to form a metal catalyst layer.

Subsequently, an electroless plating process was performed for the silicon substrate for 180 seconds at a plating temperature 78° C. by using a Ni—P plating solution of pH4 for which a sodium hypophosphite was used as a reductant to form a metal film. When a structure of a Ni—P plating film was checked by SEM, the Ni—P plating film conformally formed on a resist pattern could be confirmed. A film thickness in this case was 80 nm.

Subsequently, the silicon substrate was dipped in mixed acid (CMK-201) for two minutes at a room temperature to wet-etch the Ni—P plating film. Etching the Ni—P plating film progressed from contact portions and upper portions formed in recesses of the resist pattern, and the Ni—P plating film on pattern sidewalls was removed first. As a result, the Ni—P plating film was left on the resist pattern, and the same metal pattern as the resist pattern was formed.

(Comparative Example)

The same process as the process in the example except that a Ni—B plating solution was used as a plating solution was performed. As a result, a Ni—B plating film was not left on a resist pattern, and the Ni—B plating film was left only in recesses of the resist pattern.

In case of the Ni—B plating film, etching did not progress from contact portions.

The cases where the present disclosure is applied to manufacture the semiconductor device have been described as examples in the first and second embodiments. However, the present disclosure is not limited to manufacturing of the semiconductor devices and is applicable to other usage, too, for forming metal patterns on substrates including protrusions and recess patterns.

While certain embodiments have been described, these embodiments have been presented by way of example only, and are not intended to limit the scope of the inventions. Indeed, the metal pattern forming method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for forming a metal pattern comprising:
   forming a metal film on a surface of a substrate by an electroless plating method, the substrate including a first layer including a protrusion and a recess, and a film thickness of the metal film being a half or more of a width of the recess, wherein the thickness is measured from the top of the protrusion; and
   performing wet etching, the metal film in the recess removed by the wet etching and the metal film on the protrusion remained after the wet etching.

2. The method according to claim 1, wherein
   the metal film includes first metal and second metal, a content of the second metal in the metal film is lower than a content of the first metal in the metal film, and
   the second metal is at least one metal selected from a group consisting of phosphorous (P), tungsten (W) and molybdenum (Mo).

3. The method according to claim 2, wherein the first metal is at least one metal selected from a group consisting of nickel (Ni), cobalt (Co) and copper (Cu).

4. The method according to claim 1, wherein an average particle diameter of the metal film is 5 nm or less.

5. The method according to claim 1, wherein the metal film is amorphous.

6. The method according to claim 1, further comprising, after performing the wet etching, etching a second layer disposed under the first layer using the metal film on the protrusion as a mask, the substrate including the second layer.

7. The method according to claim 6, wherein
   the first layer includes resin, and
   the second layer includes oxide, nitride, oxynitride or semiconductor.

8. The method according to claim 1, wherein a width of the recess is 200 nm or less.

9. A method for forming a metal pattern comprising:
   forming a metal film on a surface of a substrate by an electroless plating method, the substrate including a first layer including a protrusion and a recess, and a film thickness of the metal film being a half or more of a width of the recess, wherein the recess is filled; and
   performing wet etching, the metal film in the recess removed by the wet etching and the metal film on the protrusion remained after the wet etching.

10. The method according to claim 9, wherein
    the metal film includes first metal and second metal, a content of the second metal in the metal film is lower than a content of the first metal in the metal film, and
    the second metal is at least one metal selected from a group consisting of phosphorous (P), tungsten (W) and molybdenum (Mo).

11. The method according to claim 10, wherein the first metal is at least one metal selected from a group consisting of nickel (Ni), cobalt (Co) and copper (Cu).

12. The method according to claim 9, wherein an average particle diameter of the metal film is 5 nm or less.

13. The method according to claim 9, wherein the metal film is amorphous.

14. The method according to claim 9, further comprising, after performing the wet etching, etching a second layer disposed under the first layer using the metal film on the protrusion as a mask, the substrate including the second layer.

15. The method according to claim 14, wherein
    the first layer includes resin, and
    the second layer includes oxide, nitride, oxynitride or semiconductor.

16. The method according to claim 9, wherein a width of the recess is 200 nm or less.

* * * * *